(12) United States Patent
Yang et al.

(10) Patent No.: US 10,790,268 B2
(45) Date of Patent: *Sep. 29, 2020

(54) SEMICONDUCTOR DEVICE AND METHOD OF FORMING A 3D INTEGRATED SYSTEM-IN-PACKAGE MODULE

(71) Applicant: STATS ChipPAC Pte. Ltd., Singapore (SG)

(72) Inventors: DeokKyung Yang, Incheon Si (KR); HunTeak Lee, Gyeongi-do (KR); HeeSoo Lee, Kyunggi-do (KR)

(73) Assignee: STATS ChipPAC Pte. Ltd., Singapore (SG)

( * ) Notice: Subject to any disclaimer, the term of this patent is extended or adjusted under 35 U.S.C. 154(b) by 0 days.

This patent is subject to a terminal disclaimer.

(21) Appl. No.: 16/821,202

(22) Filed: Mar. 17, 2020

(65) Prior Publication Data

US 2020/0219859 A1    Jul. 9, 2020

Related U.S. Application Data

(63) Continuation of application No. 15/697,298, filed on Sep. 6, 2017, now Pat. No. 10,636,774.

(51) Int. Cl.
*H01L 23/552* (2006.01)
*H01L 25/10* (2006.01)
(Continued)

(52) U.S. Cl.
CPC ........ *H01L 25/105* (2013.01); *H01L 21/4853* (2013.01); *H01L 21/561* (2013.01); *H01L 21/565* (2013.01); *H01L 23/5386* (2013.01); *H01L 23/552* (2013.01); *H01L 24/20* (2013.01); *H01L 25/50* (2013.01); *H01L 23/3128* (2013.01); *H01L 24/03* (2013.01); *H01L 24/05* (2013.01); *H01L 24/11* (2013.01); *H01L 24/13* (2013.01); *H01L 24/16* (2013.01); *H01L 24/81* (2013.01); *H01L 24/97* (2013.01);
(Continued)

(58) Field of Classification Search
CPC . H01L 21/4853; H01L 21/561; H01L 21/565; H01L 23/5386; H01L 23/552; H01L 24/20; H01L 25/105; H01L 25/50
USPC ........................................................ 257/659
See application file for complete search history.

(56) References Cited

U.S. PATENT DOCUMENTS 6,781,241 B2    8/2004    Nishimura et al.
8,106,499 B2    1/2012    Camacho et al.
(Continued)

*Primary Examiner* — Brook Kebede
(74) *Attorney, Agent, or Firm* — Brian M. Kaufman; Robert D. Atkins; Patent Law Group: Atkins and Associates, P.C.

(57) ABSTRACT

A semiconductor device has a first substrate and a semiconductor die disposed over the first substrate. A conductive pillar is formed on the first substrate. A first encapsulant is deposited over the first substrate and semiconductor die after forming the conductive pillar. A groove is formed in the first encapsulant around the conductive pillar. A first passive device is disposed over a second substrate. A second encapsulant is deposited over the first passive device and second substrate. The first substrate is mounted over the second substrate. A shielding layer is formed over the second encapsulant. A second passive device can be mounted over the second substrate opposite the first passive device and outside a footprint of the first substrate.

25 Claims, 20 Drawing Sheets

(51) Int. Cl.
  *H01L 25/00* (2006.01)
  *H01L 23/538* (2006.01)
  *H01L 21/48* (2006.01)
  *H01L 23/00* (2006.01)
  *H01L 21/56* (2006.01)
  *H01L 23/31* (2006.01)

(52) U.S. Cl.
  CPC ............ *H01L 2224/0345* (2013.01); *H01L 2224/03452* (2013.01); *H01L 2224/03462* (2013.01); *H01L 2224/03464* (2013.01); *H01L 2224/0401* (2013.01); *H01L 2224/0558* (2013.01); *H01L 2224/05573* (2013.01); *H01L 2224/05611* (2013.01); *H01L 2224/05624* (2013.01); *H01L 2224/05639* (2013.01); *H01L 2224/05644* (2013.01); *H01L 2224/05647* (2013.01); *H01L 2224/05655* (2013.01); *H01L 2224/1132* (2013.01); *H01L 2224/1145* (2013.01); *H01L 2224/11334* (2013.01); *H01L 2224/11462* (2013.01); *H01L 2224/11464* (2013.01); *H01L 2224/11849* (2013.01); *H01L 2224/131* (2013.01); *H01L 2224/13111* (2013.01); *H01L 2224/13116* (2013.01); *H01L 2224/13124* (2013.01); *H01L 2224/13139* (2013.01); *H01L 2224/13144* (2013.01); *H01L 2224/13147* (2013.01); *H01L 2224/13155* (2013.01); *H01L 2224/16227* (2013.01); *H01L 2224/214* (2013.01); *H01L 2224/81192* (2013.01); *H01L 2224/81815* (2013.01); *H01L 2224/81911* (2013.01); *H01L 2224/97* (2013.01); *H01L 2225/1035* (2013.01); *H01L 2225/1058* (2013.01); *H01L 2924/1533* (2013.01); *H01L 2924/15192* (2013.01); *H01L 2924/15311* (2013.01); *H01L 2924/15313* (2013.01); *H01L 2924/15321* (2013.01); *H01L 2924/15331* (2013.01); *H01L 2924/1815* (2013.01); *H01L 2924/19041* (2013.01); *H01L 2924/19042* (2013.01); *H01L 2924/19043* (2013.01); *H01L 2924/19105* (2013.01); *H01L 2924/19106* (2013.01); *H01L 2924/3025* (2013.01)

(56) References Cited

U.S. PATENT DOCUMENTS

| | | | |
|---|---|---|---|
| 8,633,100 | B2 | 1/2014 | Yang et al. |
| 8,653,654 | B2 | 2/2014 | Chandra et al. |
| 8,674,516 | B2 | 3/2014 | Han et al. |
| 8,793,868 | B2 | 8/2014 | Yamano et al. |
| 9,202,715 | B2 | 12/2015 | Kim et al. |
| 9,252,130 | B2 | 2/2016 | Kim et al. |
| 9,527,723 | B2 | 12/2016 | Lin et al. |
| 10,636,774 | B2 * | 4/2020 | Yang ............... H01L 23/5385 |
| 2004/0157407 | A1 | 8/2004 | Tong et al. |
| 2007/0246813 | A1 | 10/2007 | Ong et al. |
| 2008/0061410 | A1 | 3/2008 | Imaizumi et al. |
| 2014/0252561 | A1 | 9/2014 | Lisk et al. |
| 2016/0329299 | A1 | 11/2016 | Lin et al. |
| 2017/0040304 | A1 | 2/2017 | Shih et al. |
| 2017/0077022 | A1 * | 3/2017 | Scanlan ............... H01L 22/14 |
| 2017/0092594 | A1 | 3/2017 | Song et al. |
| 2017/0179039 | A1 | 6/2017 | Lee et al. |
| 2018/0096967 | A1 | 4/2018 | Tsai et al. |

* cited by examiner

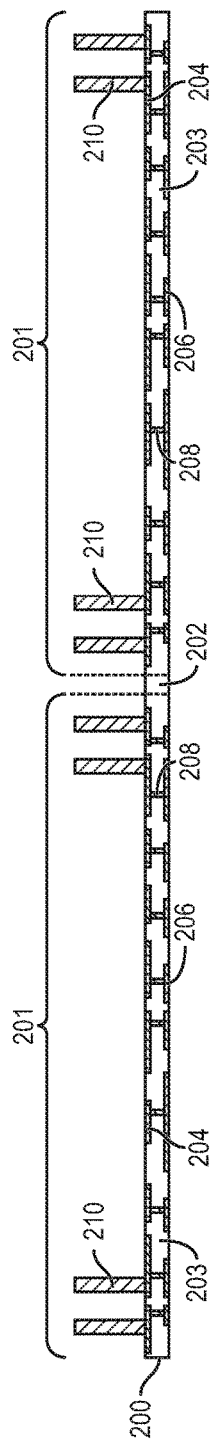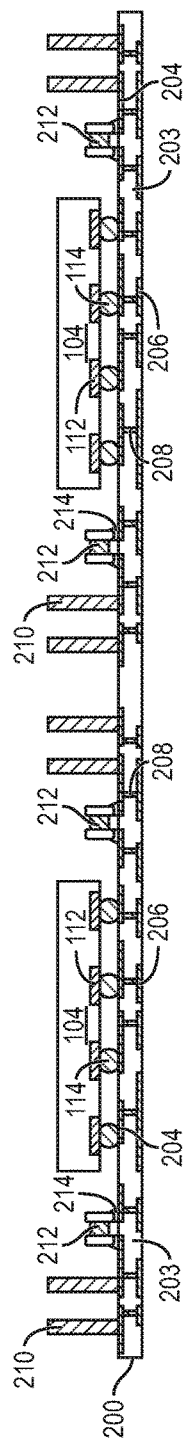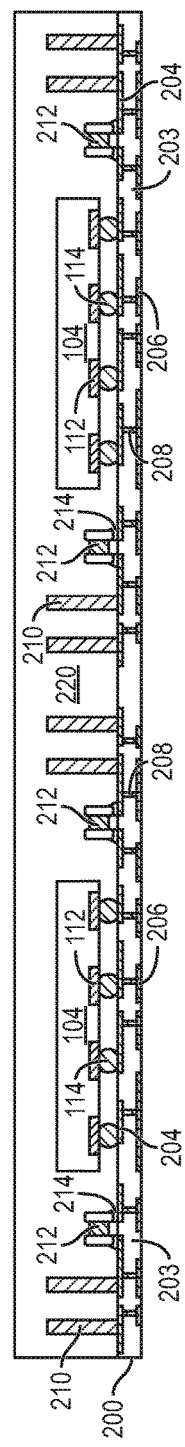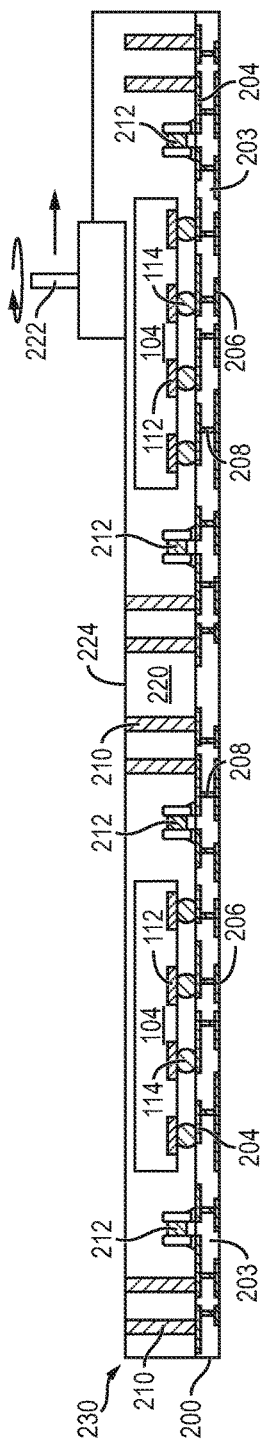

US 10,790,268 B2

SEMICONDUCTOR DEVICE AND METHOD OF FORMING A 3D INTEGRATED SYSTEM-IN-PACKAGE MODULE

CLAIM TO DOMESTIC PRIORITY

The present application is a continuation of U.S. patent application Ser. No. 15/697,298, now U.S. Pat. No. 10,636,774, filed Sep. 6, 2017, which application is incorporated herein by reference.

FIELD OF THE INVENTION

The present invention relates in general to semiconductor devices and, more particularly, to a semiconductor device and method of forming a 3D integrated system-in-package (SiP) module.

BACKGROUND OF THE INVENTION

Semiconductor devices are commonly found in modern electronic products. Semiconductor devices perform a wide range of functions such as signal processing, high-speed calculations, transmitting and receiving electromagnetic signals, controlling electronic devices, photoelectric generation, and creating visual images for television displays. Semiconductor devices are found in the fields of communications, power conversion, networks, computers, entertainment, and consumer products. Semiconductor devices are also found in military applications, aviation, automotive, industrial controllers, and office equipment.

Semiconductor packages are commonly made with several active semiconductor components, discrete passive components, and integrated passive devices (IPDs) packaged together into a single-package system, also known as a system-in-package (SiP) module. SiP modules offer higher density and enhanced electrical functionality relative to traditional semiconductor packaging.

The active and passive components are mounted to a substrate for structural support and electrical interconnect. In more advanced three dimensional (3D) packaging, components are mounted onto two opposite surfaces of a substrate. An encapsulant is deposited over the semiconductor die, discrete components, and substrate. The encapsulant is generally applied using two separate molding steps, with the components on the top and bottom surfaces of the substrate being encapsulated in separate steps. Molding two sides of a substrate separately presents warpage problems due to the thick overall molding required. Therefore, a need exists for a 3D SiP module, and method of making, that removes the need for molding two sides of a substrate.

BRIEF DESCRIPTION OF THE DRAWINGS

FIGS. 3a-3f illustrate formation of bottom SiP submodules;

DETAILED DESCRIPTION OF THE DRAWINGS

The present invention is described in one or more embodiments in the following description with reference to the figures, in which like numerals represent the same or similar elements. While the invention is described in terms of the best mode for achieving the invention's objectives, it will be appreciated by those skilled in the art that it is intended to cover alternatives, modifications, and equivalents as may be included within the spirit and scope of the invention as defined by the appended claims and their equivalents as supported by the following disclosure and drawings. The term "semiconductor die" as used herein refers to both the singular and plural form of the words, and accordingly, can refer to both a single semiconductor device and multiple semiconductor devices.

Semiconductor devices are generally manufactured using two complex manufacturing processes: front-end manufacturing and back-end manufacturing. Front-end manufacturing involves the formation of a plurality of die on the surface of a semiconductor wafer. Each die on the wafer contains active and passive electrical components, which are electrically connected to form functional electrical circuits. Active electrical components, such as transistors and diodes, have the ability to control the flow of electrical current. Passive electrical components, such as capacitors, inductors, and resistors, create a relationship between voltage and current necessary to perform electrical circuit functions.

Back-end manufacturing refers to cutting or singulating the finished wafer into the individual semiconductor die and packaging the semiconductor die for structural support, electrical interconnect, and environmental isolation. To singulate the semiconductor die, the wafer is scored and broken along non-functional regions of the wafer called saw streets or scribes. The wafer is singulated using a laser cutting tool or saw blade. After singulation, the individual semiconductor die are mounted to a package substrate that includes pins or contact pads for interconnection with other system components. Contact pads formed over the semiconductor die are then connected to contact pads within the package. The electrical connections can be made with conductive layers, bumps, stud bumps, conductive paste, or wirebonds. An encapsulant or other molding material is deposited over the package to provide physical support and electrical isolation. The finished package is then inserted into an electrical system and the functionality of the semiconductor device is made available to the other system components.

Figure 1A:
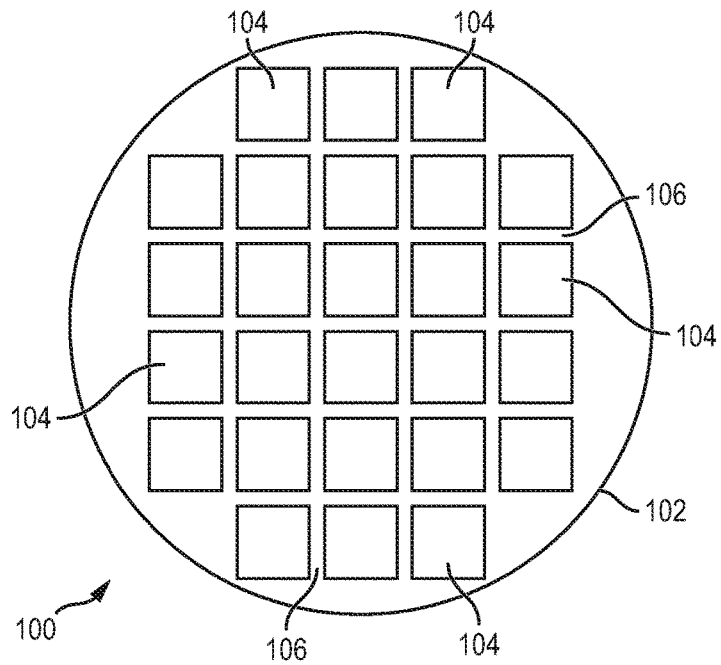
FIGS. 1a-1c illustrate a semiconductor wafer with a plurality of semiconductor die separated by a saw street.

FIG. 1a shows a semiconductor wafer 100 with a base substrate material 102, such as silicon, germanium, aluminum phosphide, aluminum arsenide, gallium arsenide, gallium nitride, indium phosphide, silicon carbide, or other bulk material for structural support. A plurality of semiconductor die or components 104 is formed on wafer 100 separated by a non-active, inter-die wafer area or saw street 106. Saw street 106 provides cutting areas to singulate semiconductor wafer 100 into individual semiconductor die 104. In one embodiment, semiconductor wafer 100 has a width or diameter of 100-450 millimeters (mm).

Figure 1B:
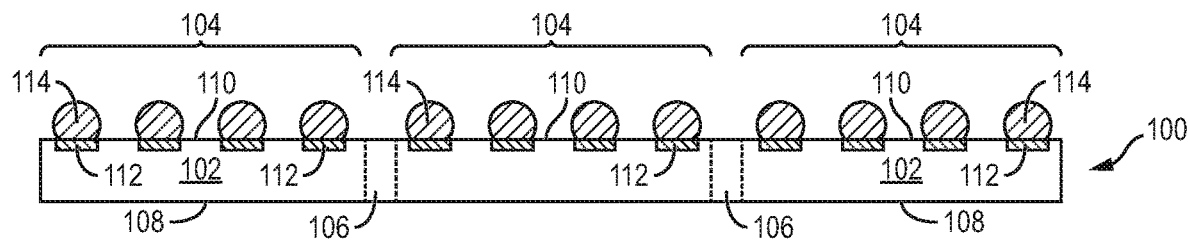

FIG. 1b shows a cross-sectional view of a portion of semiconductor wafer 100. Each semiconductor die 104 has a back or non-active surface 108 and an active surface 110 containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 110 to implement analog circuits or digital circuits, such as a digital signal processor (DSP), application specific integrated circuit (ASIC), memory, or other signal processing circuit. Semiconductor die 104 may also contain IPDs, such as inductors, capacitors, and resistors formed in or on interconnect layers over surfaces of the semiconductor die for RF signal processing.

An electrically conductive layer 112 is formed over active surface 110 using PVD, CVD, electrolytic plating, electroless plating, or other suitable metal deposition process. Conductive layer 112 can be one or more layers of aluminum (Al), copper (Cu), tin (Sn), nickel (Ni), gold (Au), silver (Ag), or other suitable electrically conductive material. Conductive layer 112 operates as contact pads electrically connected to the circuits of active surface 110.

An electrically conductive bump material is deposited over conductive layer 112 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 112 using a suitable attachment or bonding process. In some embodiments, the bump material is reflowed by heating the material above its melting point to form balls or bumps 114. In one embodiment, bump 114 is formed over an under bump metallization (UBM) having a wetting layer, a barrier layer, and an adhesion layer. Bump 114 can also be compression bonded or thermocompression bonded to conductive layer 112. Bump 114 represents one type of interconnect structure that can be formed over conductive layer 112. The interconnect structure can also use bond wires, conductive paste, stud bump, micro bump, or other electrical interconnect.

Figure 1C:
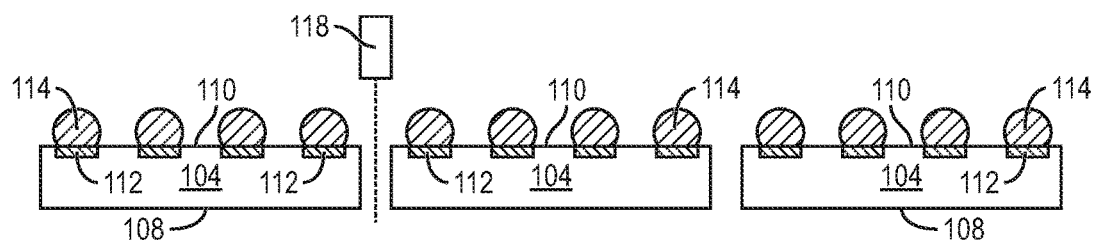

In FIG. 1c, semiconductor wafer 100 is singulated through saw street 106 using a saw blade or laser cutting tool 118 into individual semiconductor die 104. The individual semiconductor die 104 can be inspected and electrically tested for identification of known good die (KGD) after singulation.

Figure 2A:
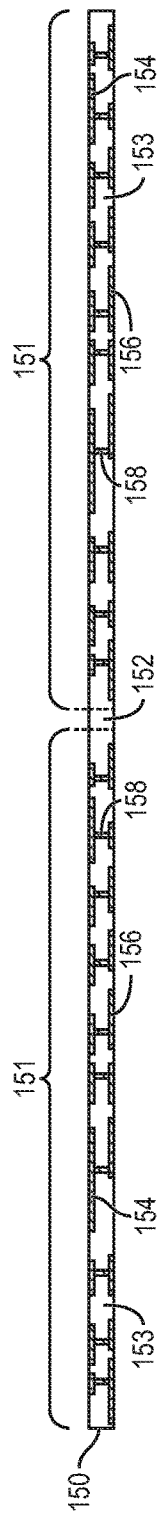
FIGS. 2a-2d illustrate formation of a panel of top SiP submodules.

FIGS. 2a-2d illustrate a process of forming a panel of top SiP submodules for combination into a SiP module. FIG. 2a shows a cross-sectional view of substrate 150 including a plurality of regions for formation of top SiP submodules 151 separated by saw streets 152. While only two regions for forming submodules 151 are shown, substrate 150 is much larger in other embodiments, with room to form hundreds or thousands of submodules 151 in parallel. Substrate 150 is formed from a base insulating material 153 with conductive layers 154 and 156 formed on the two major surfaces of the insulating layer. In some embodiments, substrate 150 is formed using a plurality of insulating layers 153 interleaved with a plurality of conductive layers, which allows for more complicated signal routing. Portions of conductive layers 154 and 156 are electrically common or electrically isolated depending on the design and function of the SiP module being formed.

Conductive layers 154 and 156 can be one or more layers of Al, Cu, Sn, Ni, Au, Ag, or other suitable electrically conductive material. Conductive vias 158 extend through insulating layer 153 to electrically connect portions of conductive layer 154 to portions of conductive layer 156. Conductive layers 154 and 156 provide horizontal electrical interconnect across substrate 150, while conductive vias 158 provide vertical electrical interconnect through substrate 150. In one embodiment, conductive vias 158 are formed by providing an opening through insulating layer 153 by etching, drilling, laser ablation, or another suitable process, and then depositing or plating conductive material into the opening. In other embodiments, conductive material for conductive vias 158 is deposited into openings of insulating layer 153 as part of forming conductive layers 154 or 156.

Substrate 150 can also be any suitable laminate interposer, PCB, wafer-form, strip interposer, leadframe, or other type of substrate. Substrate 150 may include one or more laminated layers of polytetrafluoroethylene (PTFE) pre-impregnated (prepreg), FR-4, FR-1, CEM-1, or CEM-3 with a combination of phenolic cotton paper, epoxy, resin, woven glass, matte glass, polyester, and other reinforcement fibers or fabrics. Insulating layer 153 contains one or more layers of silicon dioxide ($SiO_2$), silicon nitride ($Si_3N_4$), silicon oxynitride (SiON), tantalum pentoxide ($Ta_2O_5$), aluminum oxide ($Al_2O_3$), solder resist, polyimide, benzocyclobutene (BCB), polybenzoxazoles (PBO), and other material having similar insulating and structural properties. Substrate 150 can also be a multi-layer flexible laminate, ceramic, copper clad laminate, glass, or semiconductor wafer including an active surface containing one or more transistors, diodes, and other circuit elements to implement analog or digital circuits.

Figure 2B:
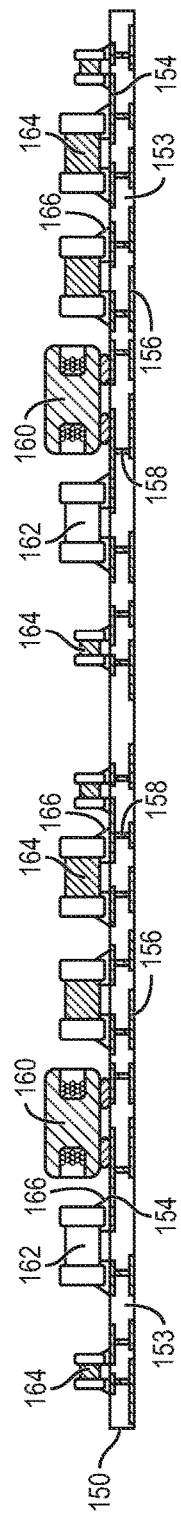

In FIG. 2b, discrete devices 160, 162, and 164 are surface mounted onto conductive layer 154. FIG. 2b shows inductors 160, resistors 162, and capacitors 164 mounted onto substrate 150, but any combination of active and passive devices can be provided as desired to implement the intended functionality of a SiP module. In one embodiment, discrete devices 160-164 implement a band-pass filter or another radio frequency (RF) signal processing network. Discrete devices 160-164 are mechanically bonded and electrically connected to conductive layer 154 through solder or solder paste 166. In one embodiment, solder paste 166 is printed onto substrate 150, reflowed with discrete devices 160-164 in physical contact, and then defluxed.

Figure 2C:
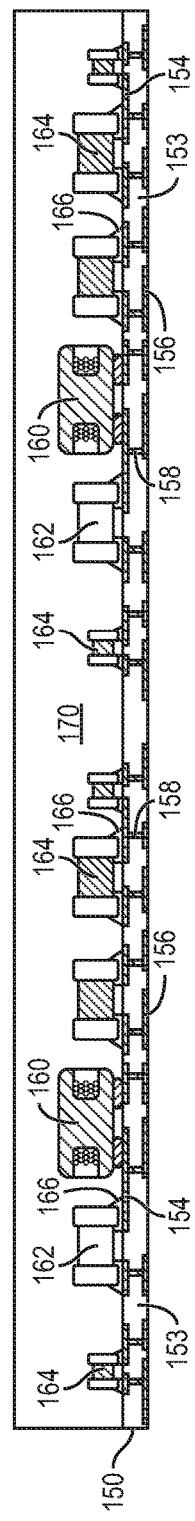

In FIG. 2c, an encapsulant or molding compound 170 is deposited over discrete devices 160-164 and substrate 150 using a paste printing, compressive molding, transfer molding, liquid encapsulant molding, vacuum lamination, spin coating, or other suitable applicator. Encapsulant 170 can be polymer composite material, such as epoxy resin, epoxy acrylate, or polymer with or without a proper filler. Encapsulant 170 is non-conductive, provides structural support, and environmentally protects the semiconductor device from external elements and contaminants. In some embodiments, encapsulant 170 is deposited with a thickness to completely cover discrete devices 160-164. In other embodiments, active or passive components mounted on substrate 150 can remain exposed from encapsulant 170 by using film-assisted molding.

Figure 2D:
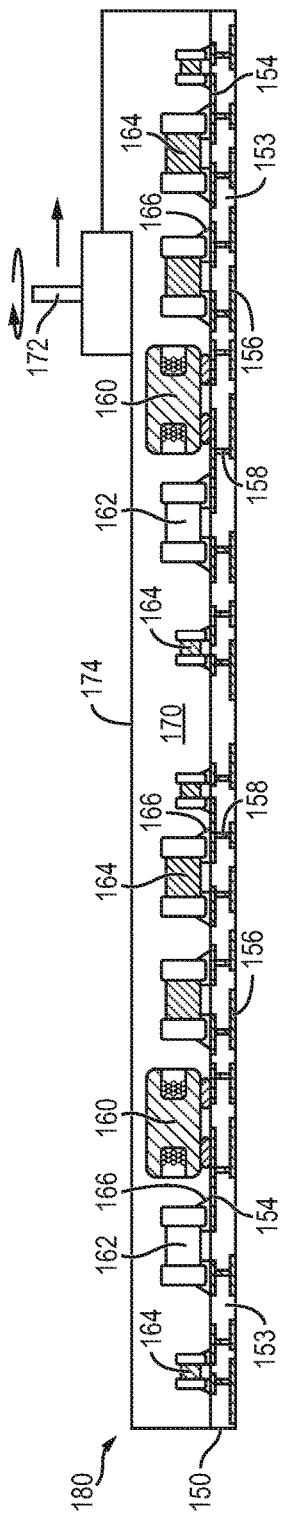

In FIG. 2d, a portion of encapsulant 170 is optionally removed by grinder 172 to expose or create a new back surface 174 of encapsulant 170. Grinder 172 planarizes encapsulant 170 to form surface 174. Alternatively, encapsulant 170 is planarized using chemical mechanical planarization (CMP), an etching process, or laser direct ablation (LDA). In some embodiments, grinder 172 also planarizes some active or passive components disposed on substrate 150. Performing the molding of encapsulant 170 to a larger thickness than necessary and then backgrinding helps to control panel warpage. Encapsulating substrate 150 and discrete devices 160-164 create a strip or panel 180 of top SiP submodules.

FIGS. 3a-3f illustrate forming bottom SiP submodules. The process begins in FIG. 3a with a substrate 200 having locations to form a plurality of bottom SiP submodules 201 separated by saw streets 202. Substrate 200 is similar to substrate 150 used to form top SiP submodules 151. Substrate 200 includes one or more insulating layers 203 and conductive layers 204 and 206 on opposite sides of the substrate. Portions of conductive layers 204 and 206 are electrically connected to each other by conductive vias 208 through substrate 200. Conductive pillars 210 are formed on contact pads of conductive layer 204. Conductive pillars 210 are formed by depositing one or more layers of Al, Cu, Sn, Ni, Au, Ag, or other suitable conductive material into openings of a masking layer. In other embodiments, conductive pillars 210 are formed by another suitable metal deposition technique.

In FIG. 3b, semiconductor die 104 and discrete devices 212 are surface mounted onto substrate 200 and electrically connected to conductive layer 204 by solder paste 214 and solder bumps 114. FIG. 3c shows an encapsulant 220 deposited over substrate 200, conductive pillars 210, semiconductor die 104, and discrete devices 212, similar to encapsulant 170 in FIG. 2c. Encapsulant 220 is backgrinded using grinder 222 in FIG. 3d, similar to FIG. 2d. Backgrinding panel 230 results in a new back surface 224 of encapsulant 220 being coplanar with top surfaces of conductive pillars 210. In some embodiments, semiconductor die 104 is exposed or further backgrinded in the same step. In one embodiment, some encapsulant remains covering conductive pillars 210 after backgrinding.

Figure 3E:
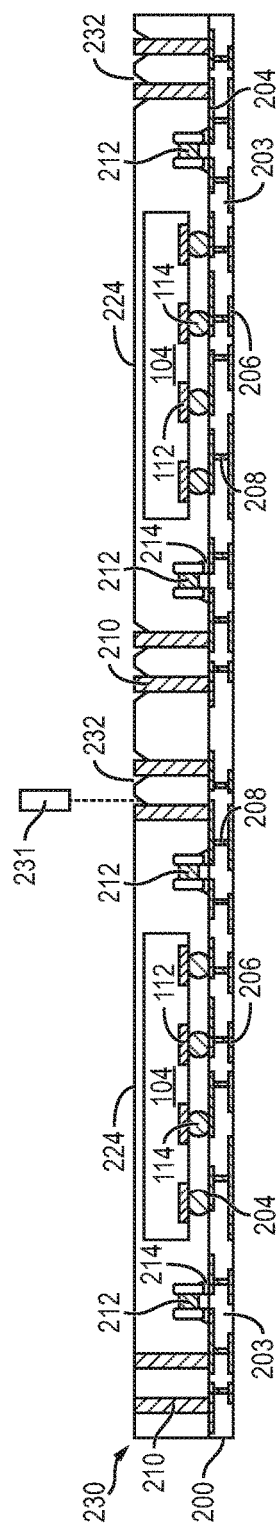

In FIG. 3e, side surfaces of conductive pillars 210 are exposed from the encapsulant by using LDA with laser 231, or another suitable etching process, to form optional notches or grooves 232 either partially around or totally surrounding the conductive pillars. Each individual groove 232 can extend completely around one conductive pillar 210 in approximately a circle. A surface of encapsulant 220 within groove 232 extends approximately linearly from conductive pillar 210 to surface 224 of the encapsulant around an entire perimeter of each conductive pillar. In other embodiments, the surface of encapsulant 220 within groove 232 includes other profile shapes. In embodiments where encapsulant 220 remains covering conductive pillars 210 after backgrinding, or no backgrinding is performed, laser 231 is also used to expose the top surface of the conductive pillars.

Figure 3F:
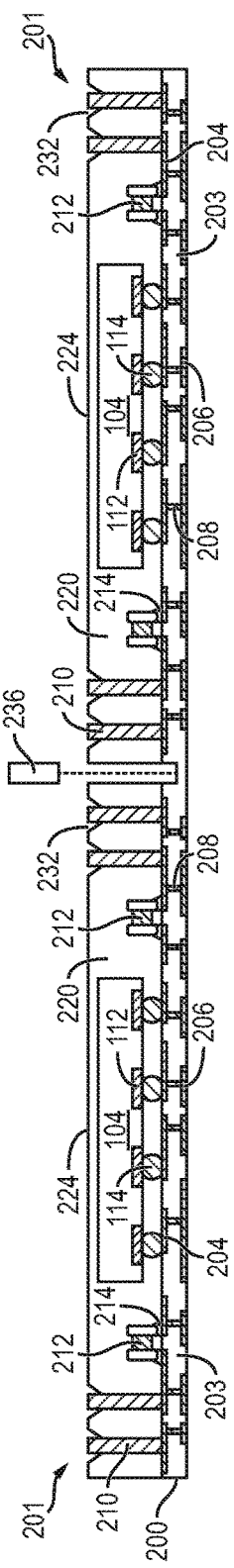

In FIG. 3f, panel 230 is singulated through substrate 200 and encapsulant 220 into a plurality of bottom SiP submodules 201 using saw blade, laser cutting tool, or water cutting tool 236. Each of the individual bottom SiP submodules 201 includes a semiconductor die 104, discrete devices 212, or any other desired combination of electrical components.

Figure 4A:
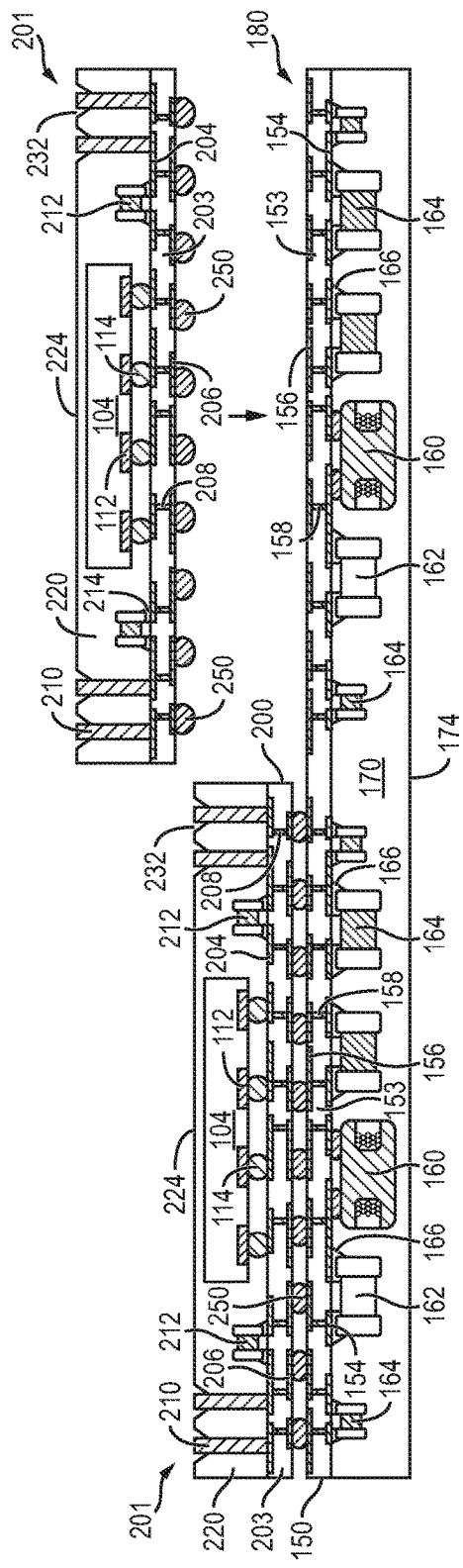
FIGS. 4a-4b illustrate mounting the bottom SiP submodules onto the panel of top SiP submodules to form a SiP module.

In FIG. 4a, top SiP panel 180 from FIG. 2d is flipped and disposed on a carrier. A carrier with a double-sided tape, thermal release tape, UV tape, or other appropriate interface layer is used to hold panel 180 in some embodiments. The singulated bottom SiP submodules 201 are disposed onto panel 180. In some embodiments, a block vacuum is used to mount bottom SiP submodules 201 onto top SiP panel 180. Bottom SiP submodules 201 and the top SiP submodules 151 of panel 180 can be tested prior to mounting to discard or not use malfunctioning units, thus increasing yield and reducing costs.

Conductive bumps 250 are reflowed between bottom SiP submodules 201 and top SiP panel 180 for mechanical bonding and electrical interconnection between substrate 150 and substrate 200. In other embodiments, bumps 250 are thermocompression bonded. Thermocompression bonding can occur separately for each bottom SiP submodule 201, or each bottom SiP submodule can be gang thermocompression bonded to panel 180 at once. Bumps 250 are formed similarly to bumps 114. Bumps 250 can be formed on substrate 200 before or after singulating panel 230 into bottom SiP submodules 201, or can be formed on substrate 150. Bumps 252 are formed on the exposed ends of pillars 210 and extend into grooves 232. Bumps 252 are applied in a similar manner as bumps 114. Bumps 252 are formed on pillars 210 prior to singulation of panel 230 into bottom SiP submodules 201 in some embodiments.

Figure 4B:
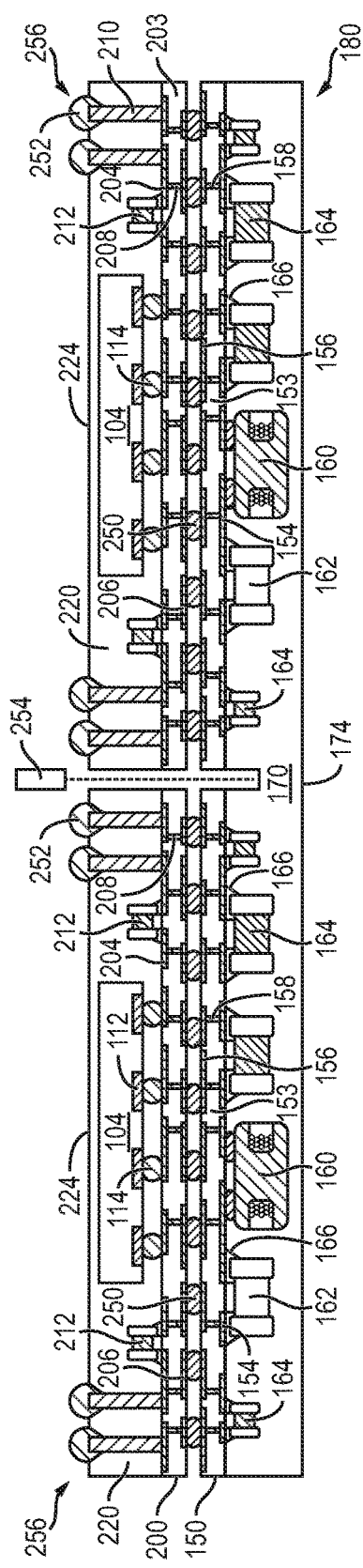
Figure 5:
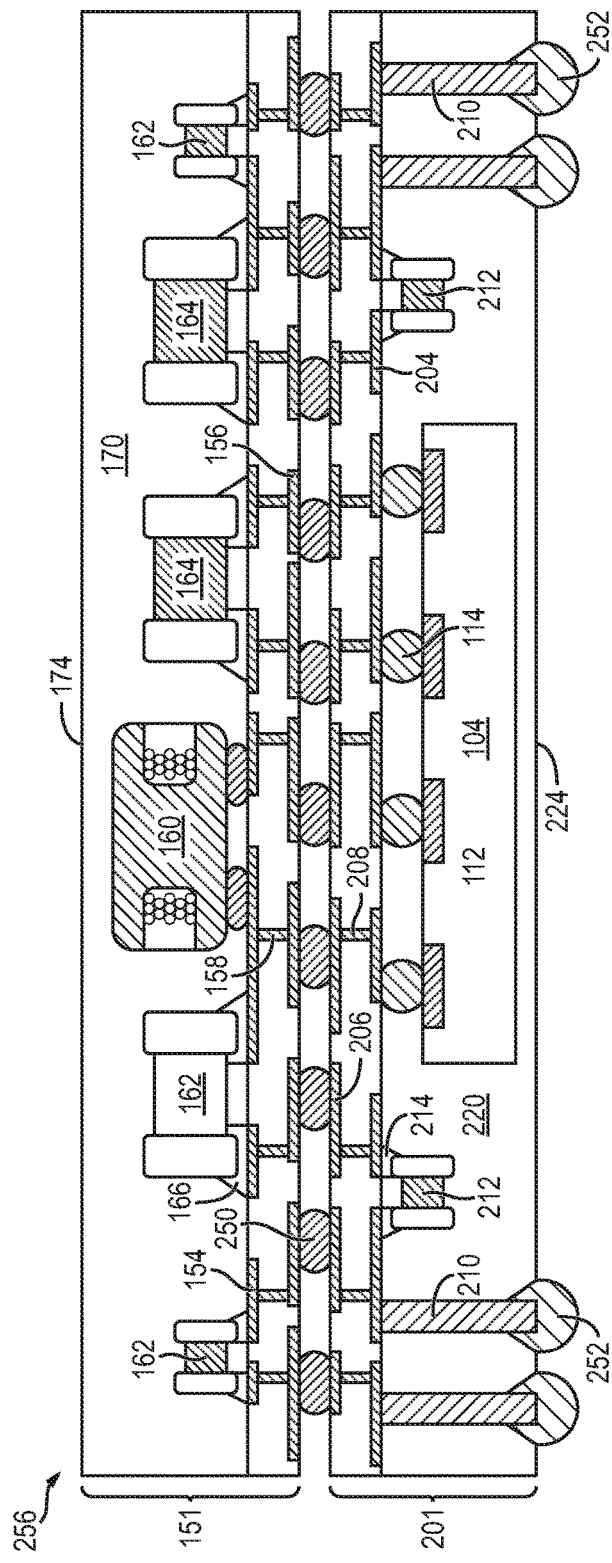
FIG. 5 illustrates a SiP module formed with separate top and bottom substrates attached to each other.

In FIG. 4b, top SiP panel 180 with bottom SiP submodules 201 attached is singulated through substrate 150 and encapsulant 170 into a plurality of double-sided SiP modules 256. FIG. 5 illustrates a completed SiP module 256. Discrete devices 160-164 are electrically coupled to semiconductor die 104, discrete devices 212, and pillars 210 through conductive layer 154, conductive vias 158, conductive layer 156, conductive bumps 250, conductive layer 206, conductive vias 208, and conductive layer 204. Discrete devices 160-164 are electrically connected to semiconductor die 104 to provide desired passive functionality. In one embodiment, discrete devices 160-164 form an RF signal processing network between semiconductor die 104 and an input or output terminal of the SiP module at a conductive pillar 210. In other embodiments, a data storage device on substrate 150 is used by a processor of semiconductor die 104.

SiP module 256 is a 3D integrated SiP module that is made double-sided by separately encapsulating the two sides of the module over different substrates, and then attaching the substrates of the two sides together. SiP module 256 is a highly integrated semiconductor package with advanced functionality. Forming the two sides of SiP module 256 separately reduces warpage versus molding two sides of a single substrate in two different molding steps.

Figure 6A:
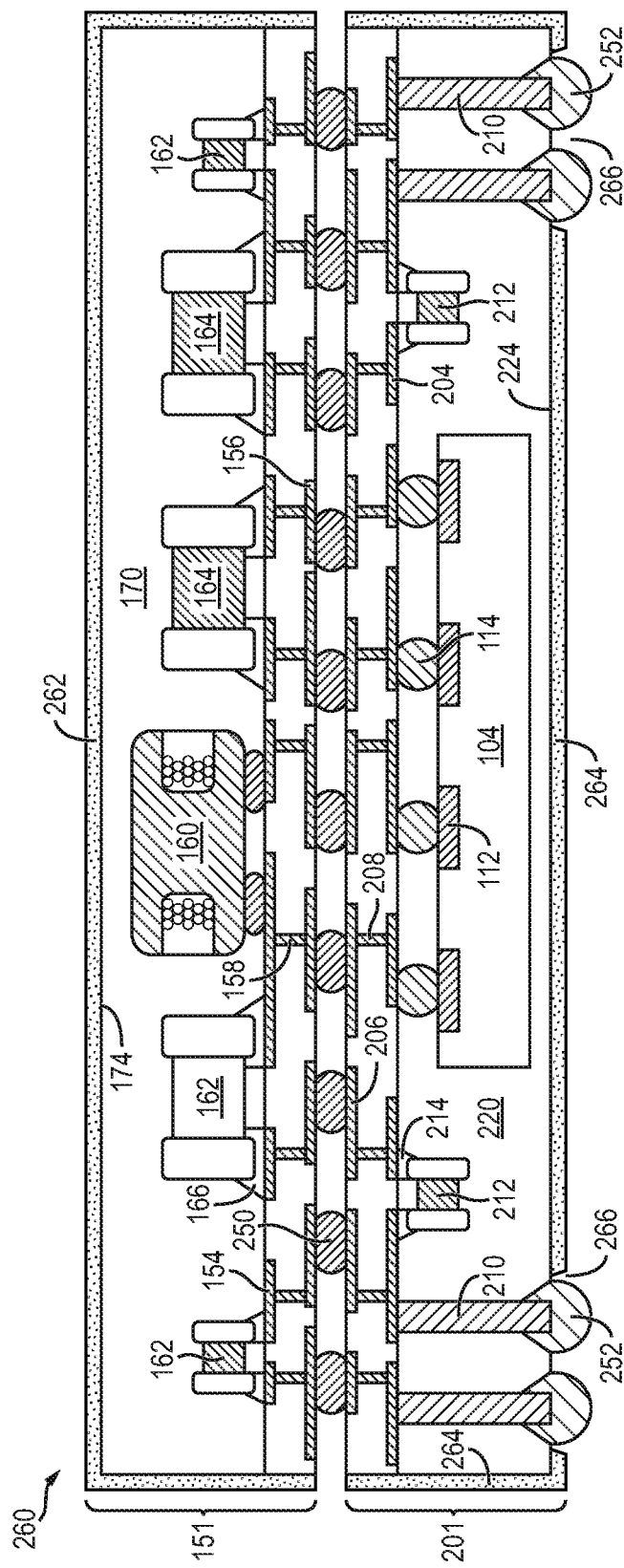
FIGS. 6a-6b illustrate forming an electromagnetic interference (EMI) shield over the SiP module.
Figure 6B:
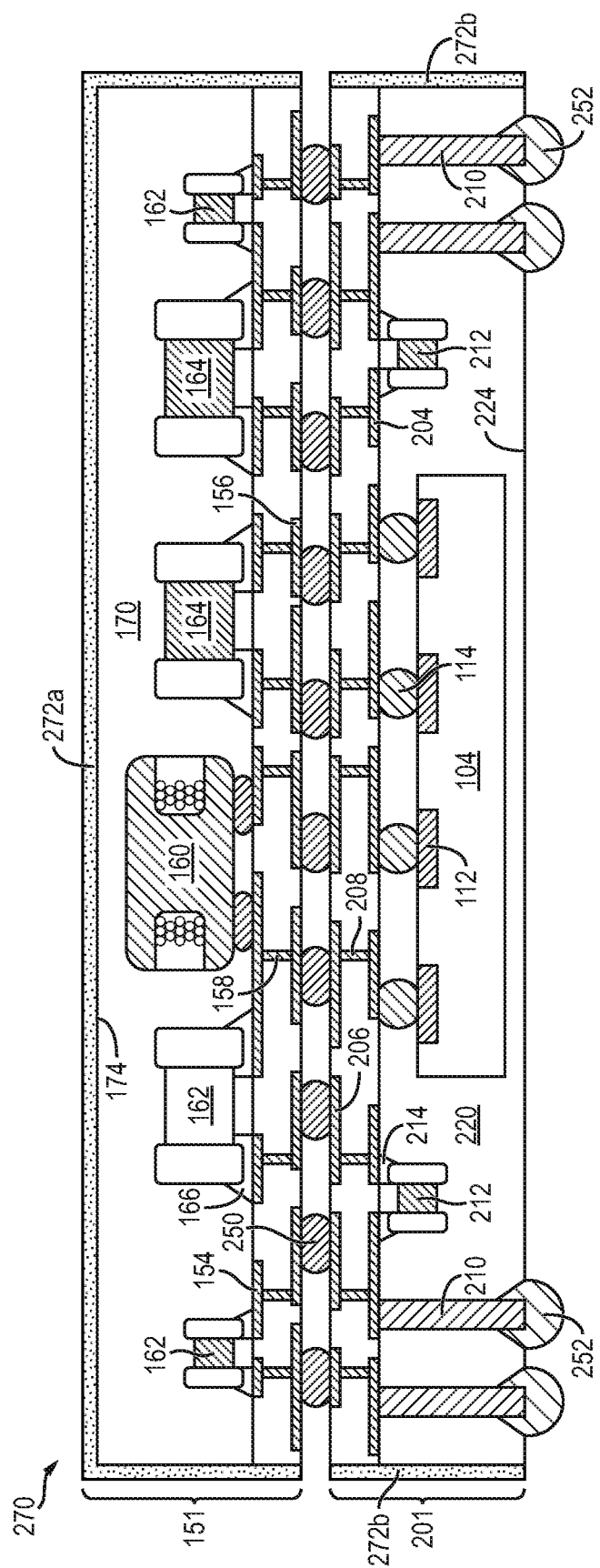

FIGS. 6a-6b show options for EMI shielding of the SiP modules. In FIG. 6a, SiP module 260 is manufactured by separately applying shielding layer 262 over top SiP submodules 151 and shielding layer 264 over bottom SiP submodules 201. Shielding layer 264 is formed over bottom SiP submodule 201 after singulation in FIG. 3f. Openings 266 are etched through shielding layer 264 to expose pillars 210 for electrical interconnect. In some embodiments, shielding layer 264 remains extending to one or more pillars 210 for electrical grounding through the conductive pillars. In one embodiment, top SiP panel 180 is flipped after bottom SiP submodules 201 are mounted and prior to singulation. Panel 180 is singulated to form a plurality of separated SiP modules 260, and then EMI shield 262 is deposited over top SiP submodules 151.

Shielding layers 262 and 264 are applied over SiP submodules 151 and 201 in two separate metal deposition steps using appropriate metal deposition techniques, e.g., CVD, PVD, or electroless plating. Shielding layer 262 covers top and side surfaces of top SiP submodule 151, while shielding layer 264 covers bottom and side surfaces of bottom SiP submodule 201. Every external surface of SiP module 260 is substantially covered in shielding layers 262 and 264 other than openings formed for external interconnection.

In FIG. 6b, only a single metal deposition step is performed over the final SiP modules as shown in FIG. 5. The SiP modules are transfer mounted onto a different carrier with top SiP submodules 151 oriented away from the carrier, and then shielding layer 272 is deposited. Shielding layer 272a covers the top and side surfaces of top SiP submodules 151 and shielding layer 272b covers side surfaces of bottom SiP submodule 201. Shielding layers 272a and 272b are formed in a single metal deposition step. Shielding layers 262, 264, and 272 reduce the amount of external EMI that reaches the electrical components of SiP modules 260 and 270.

Figure 7A:
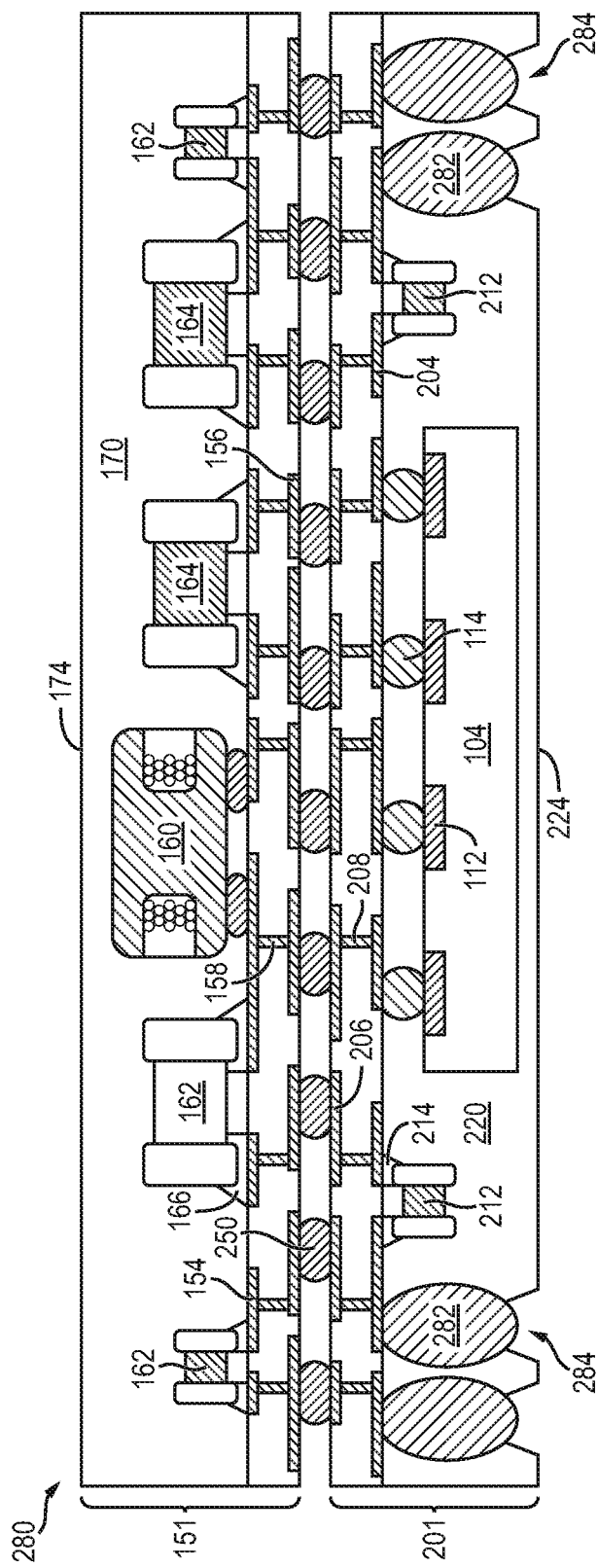
FIGS. 7a-7d illustrate forming the SiP modules with alternative interconnect structures.

FIGS. 7a-7d illustrate alternative interconnect structures usable with the SiP modules. FIG. 7a shows SiP module 280 with conductive bumps 282 mounted onto conductive layer 204 of substrate 200 in place of conductive pillars 210. Conductive bumps 282 are reflowed or thermocompression bonded to attach the bumps to conductive layer 204. Encapsulant 220 is deposited over conductive bumps 282, and openings 284 are formed in the encapsulant to expose the conductive bumps for subsequent interconnection. Conductive bumps 252 can be deposited over bumps 282, and then reflowed together to form a uniform body of solder extending from conductive layer 204 to over surface 224 of encapsulant 220.

Figure 7B:
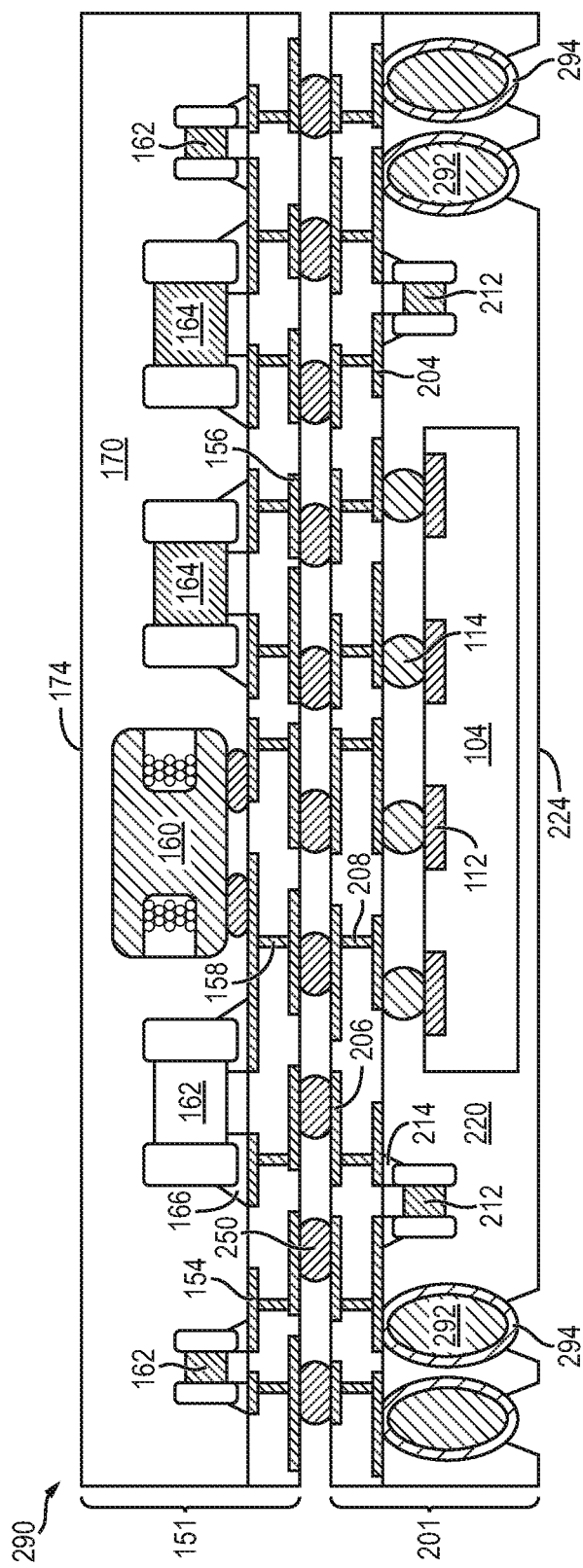

FIG. 7b illustrates SiP module 290 with conductive pillars 210 replaced by copper core solder balls (CCSB) 292-294. CCSB are formed using a copper core 292 coated in solder 294. Solder 294 is plated onto copper core 292 in some embodiments. In one embodiment, a layer of Nickel is plated between solder 294 and copper core 292. CCSB 292-294 are used similarly to conductive bumps 282. CCSB offer improved resistance to electromigration, provide a more solid bump to maintain bump height, and increase thermal conductivity from substrate 200 to a PCB of an electronic device that SiP module 290 is integrated into.

Figure 7C:
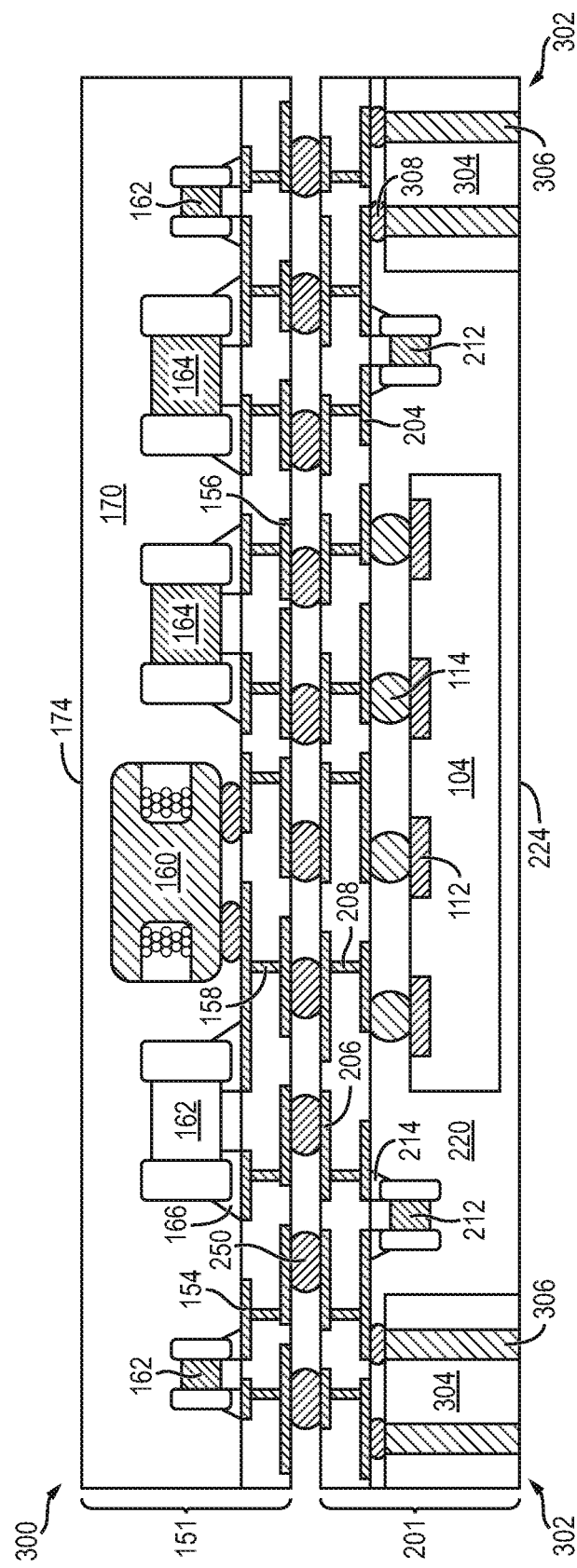

FIG. 7c illustrates SiP modules 300 using e-Bar or PCB units 302 for electrical interconnection between substrate 200 and a larger system. PCB units 302 include a core substrate 304 with conductive vias 306 formed through the core substrate. In some embodiments, contact pads are formed on the top and bottom surfaces of PCB units 302. Solder mask layers can be used over the contact pads. PCB units 302 are mounted onto substrate 200 with solder 308 mechanically attaching the PCB units and electrically connecting conductive vias 306 to conductive layer 204. Backgrinding encapsulant 220, as in FIG. 3d, exposes conductive vias 306 and makes the conductive vias coplanar with core substrate 304 and encapsulant 220. In some embodiments, each PCB unit 302 extends across saw street 202 between two adjacent devices in panel 230, and singulating the panel in FIG. 3e will cut through the PCB units. Bumps 252 are disposed on conductive vias 306 for subsequent interconnection. In some embodiments, grooves 232 are formed into core substrate 304 for improved resilience of the physical connection of bumps 252.

Figure 7D:
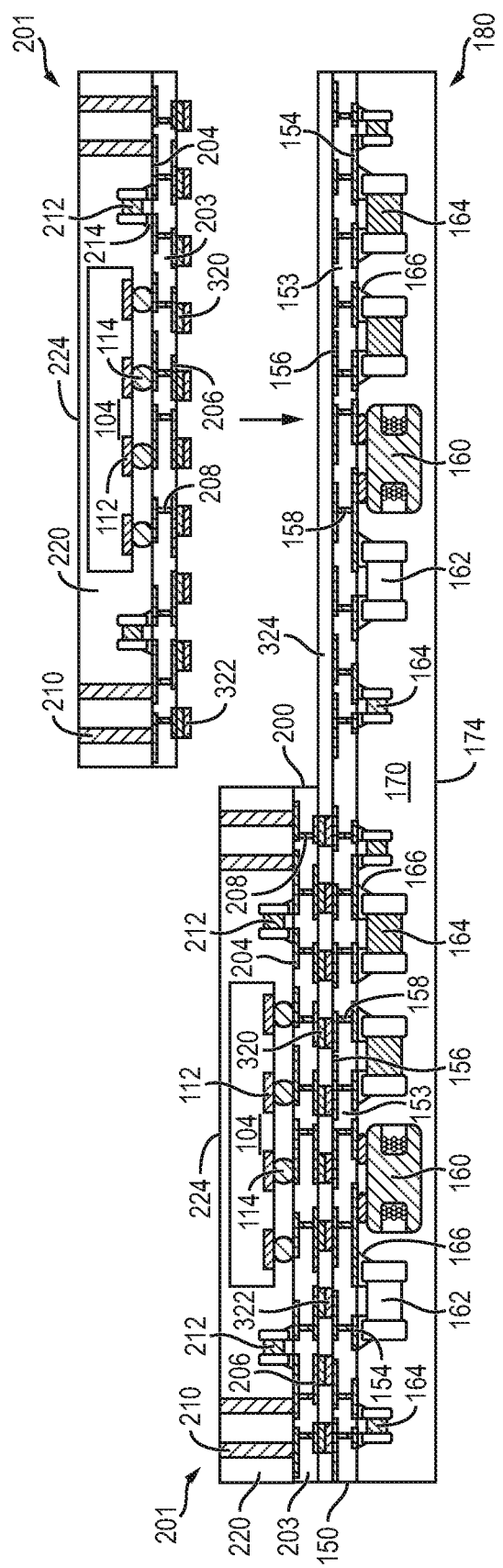

FIG. 7d shows bumps 250 between substrates 150 and 200 replaced by micro pillars 320. Micro pillars 320 are formed by plating copper onto contact pads of conductive layer 206 in one embodiment. Solder cap 322 is plated onto micro pillars 320. In one embodiment, micro pillars 320 and solder caps 322 are deposited into common masking layer openings with each other. An optional non-conductive film (NCF) or paste (NCP) 324 is disposed on substrate 150 to aid in thermocompression bonding of solder cap 322 to conductive layer 156. Solder caps 322 can alternatively be reflowed onto conductive layer 156 with or without NCP 324. Micro pillars 320 can be used with any of the interconnect structures disclosed above, including conductive bumps 282, CCSB 292-294, and PCB units 302. Formation of SiP modules using micro pillars 320 proceeds substantially the same as formation of SiP modules 256, but with conductive bumps 250 replaced.

Figure 8A:
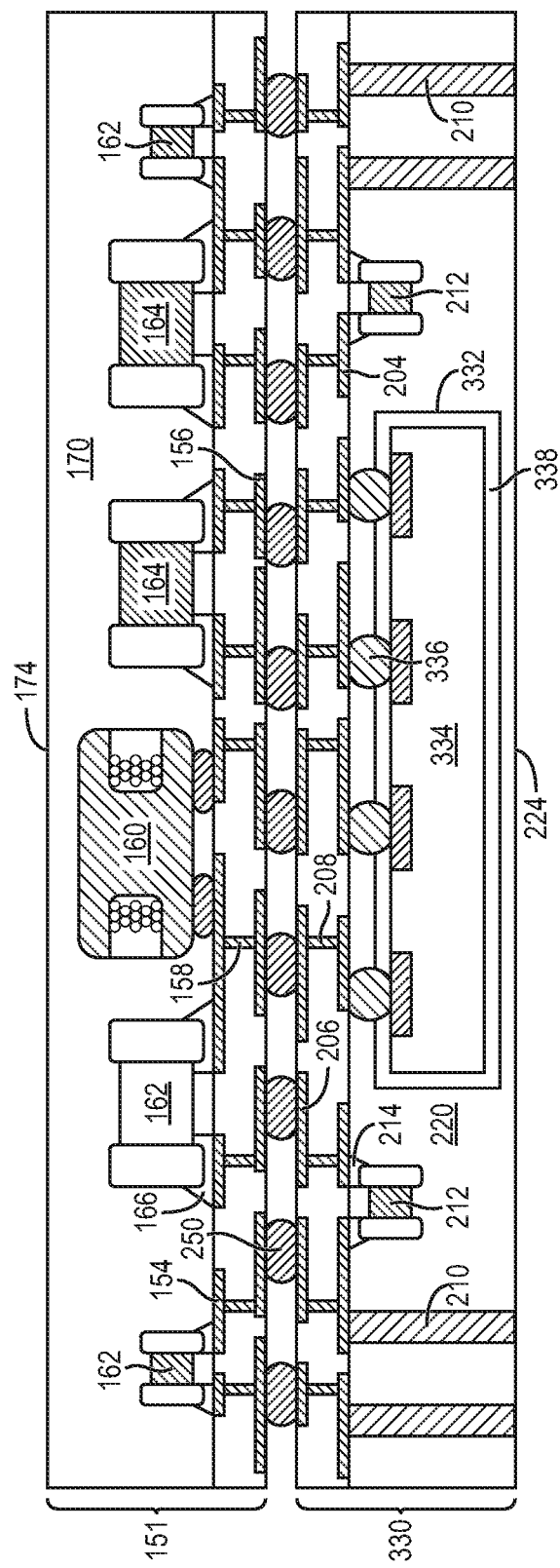
FIGS. 8a-8c illustrate forming a SiP module incorporating separately packaged semiconductor die.
Figure 8B:
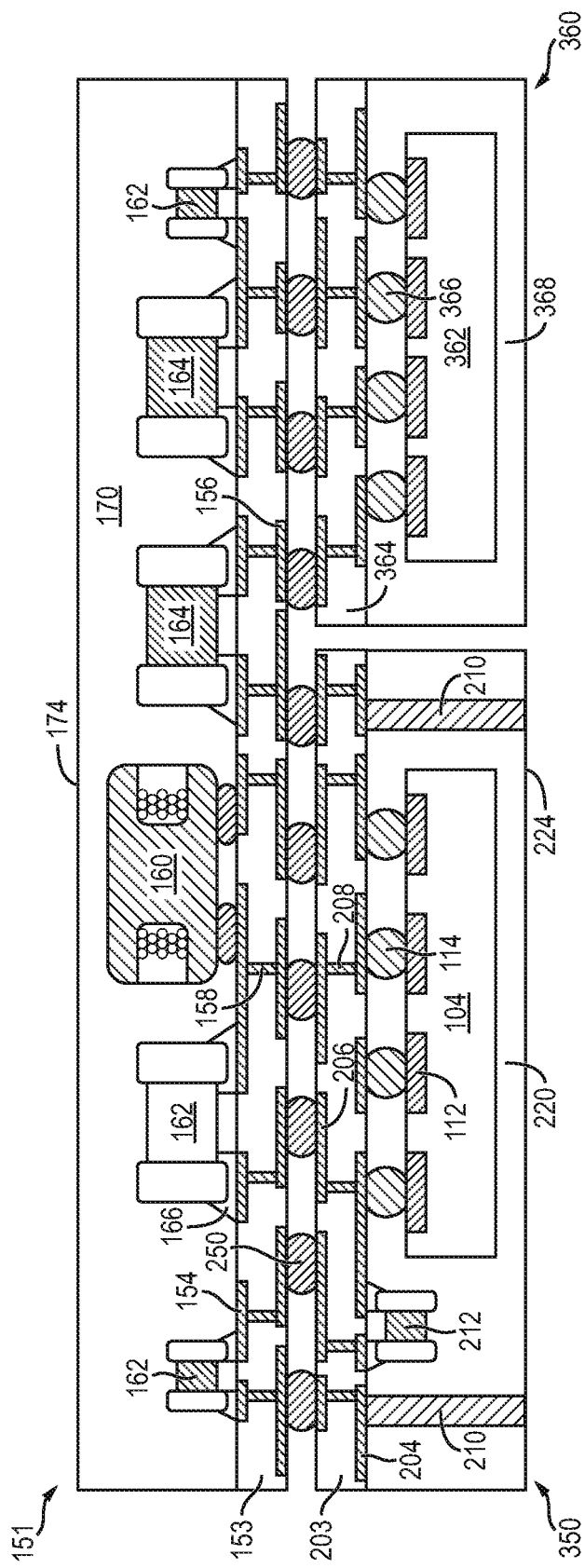
Figure 8C:
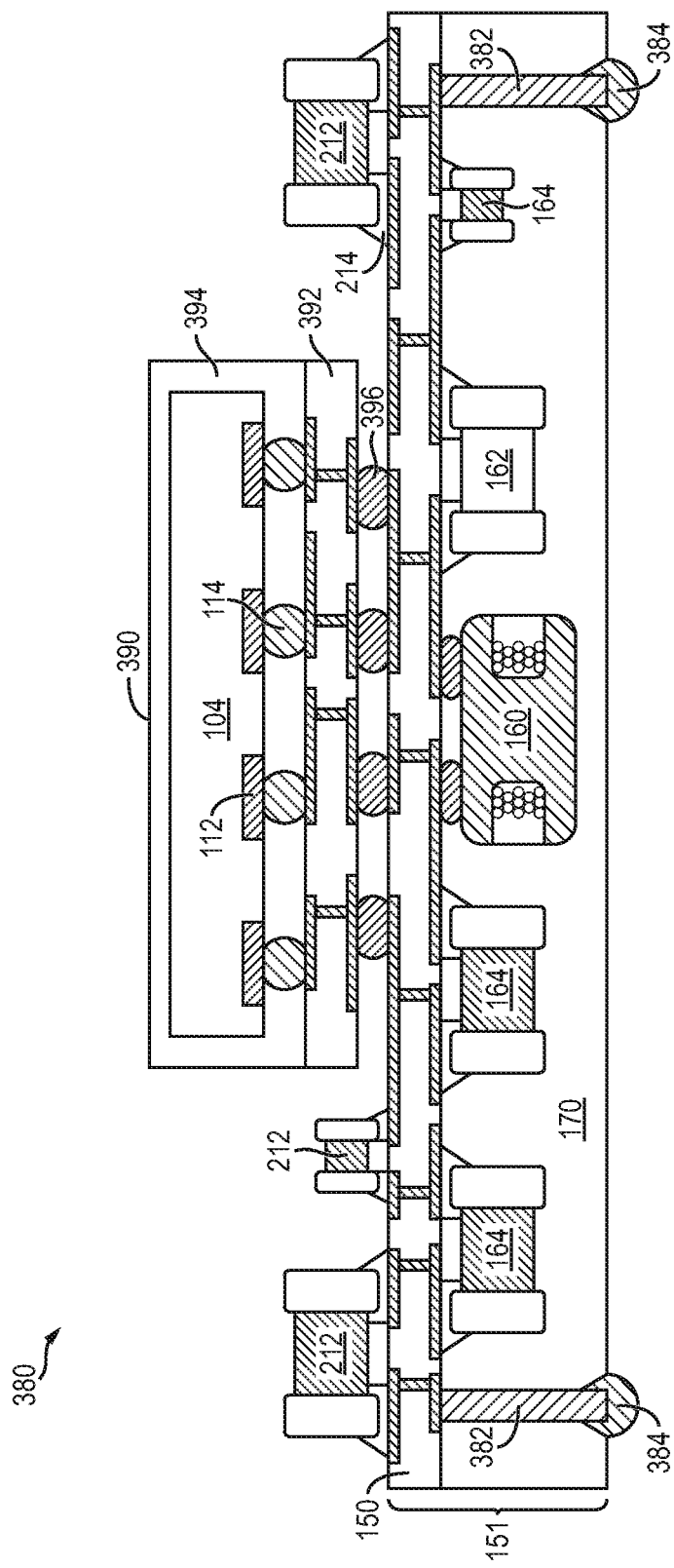

FIGS. 8a-8c illustrate usage of separately packaged semiconductor die to form SiP modules. FIG. 8a shows a bottom SiP submodule 330 replacing bottom SiP submodule 201. Bottom SiP submodule 330 is similar to bottom SiP submodule 201, but incorporates a semiconductor package 332 instead of the bare semiconductor die 104. Semiconductor die 334 is bumped with conductive bumps 336 and encapsulated with encapsulant 338 to form package 332. In other embodiments, other types of semiconductor packages 332 are mounted on substrate 200. The packages 332 in bottom SiP submodule 330 can include leadframes or substrates for the package.

FIG. 8b illustrates two separate bottom SiP submodules 350 and 360 disposed on top SiP submodule 151. Bottom SiP submodule 350 is similar to bottom SiP submodule 201, and includes semiconductor die 104, discrete devices 212, and conductive pillars 210. Bottom SiP submodule 360 is a separately packaged semiconductor die 362. Die 362 is disposed on a substrate 364 using conductive bumps 366 and molded within encapsulant 368. Any other type of semiconductor package can be mounted to conductive layer 156 of substrate 150 adjacent to bottom SiP submodule 350. Bottom SiP submodule 360 can include other types of substrates or leadframes, or can be formed without a substrate as with semiconductor package 332 in FIG. 8a. Bottom SiP submodule 360 can include conductive pillars 210, or other vertical interconnect structures, to allow connection through bottom SiP submodule 360 to an underlying substrate of a larger system as in FIGS. 11a-11b. Bottom SiP submodule 360 can also incorporate discrete passive devices and any other features of bottom SiP submodules 350 or 201.

In FIG. 8c, SiP module 380 includes top SiP submodule 151 formed with conductive pillars 382, similar to conductive pillars 210, to become the bottom SiP submodule. Conductive bumps 384 are provided over conductive pillars 382, similar to conductive bumps 252, for mounting of the SiP module to a larger substrate of an electronic device. Discrete devices 212 and semiconductor package 390 are mounted on substrate 150 using solder or solder paste 214 and conductive bumps 396. Semiconductor package 390 is similar to semiconductor package 360 in FIG. 8b. As illustrated, semiconductor package 390 includes semiconductor die 104 mounted on substrate 392 and molded with encapsulant 394. Other semiconductor package types are used in other embodiments.

Figure 9A:
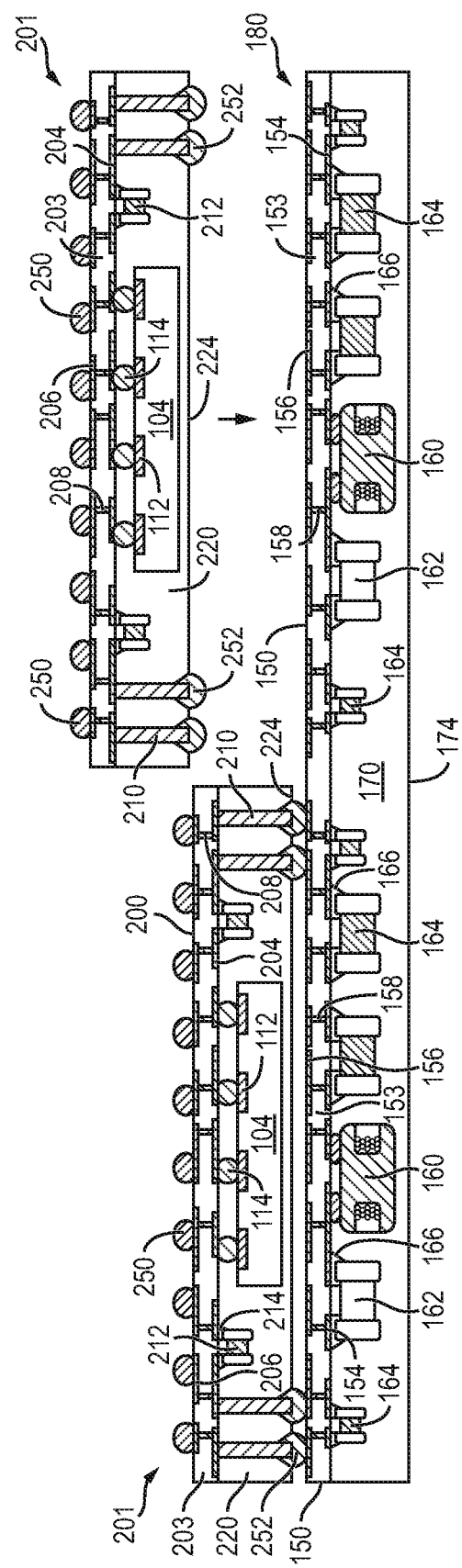
FIGS. 9a-9b illustrate an alternative combination of the SiP top and SiP bottom into a SiP module.
Figure 9B:
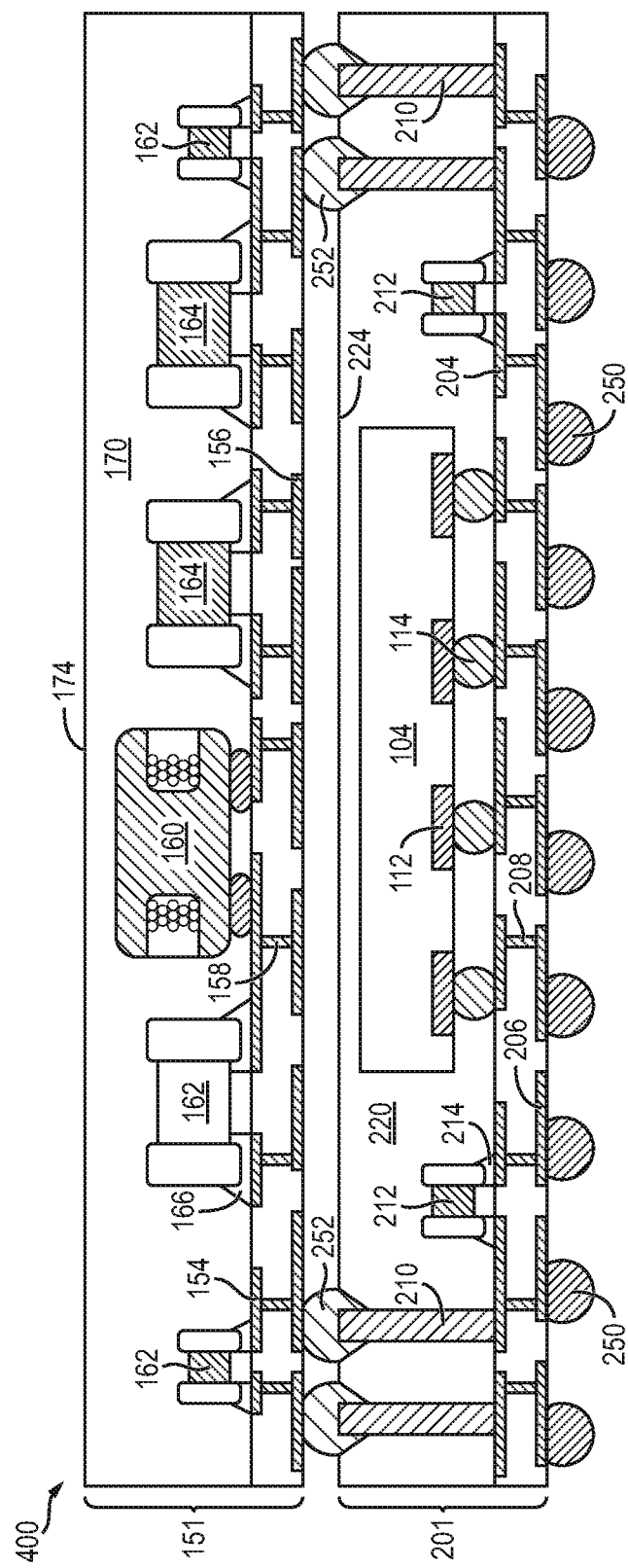

FIGS. 9a-9b illustrate mounting bottom SiP submodules 201 onto top SiP panel 180 using bumps 252 instead of bumps 250. Bottom SiP submodules 201 are disposed on panel 180 upside-down relative to the process in FIGS. 4a-4b, but otherwise the overall process is similar. Both substrates 150 and 200 are oriented toward the bottom of the SiP module within their respective submodules 151 and 201. Top SiP panel 180 is singulated to form SiP modules 400 in FIG. 9b. Conductive bumps 250 are exposed at the bottom of SiP module 400 for subsequent electrical integration of the SiP module into an electronic device.

Figure 10A:
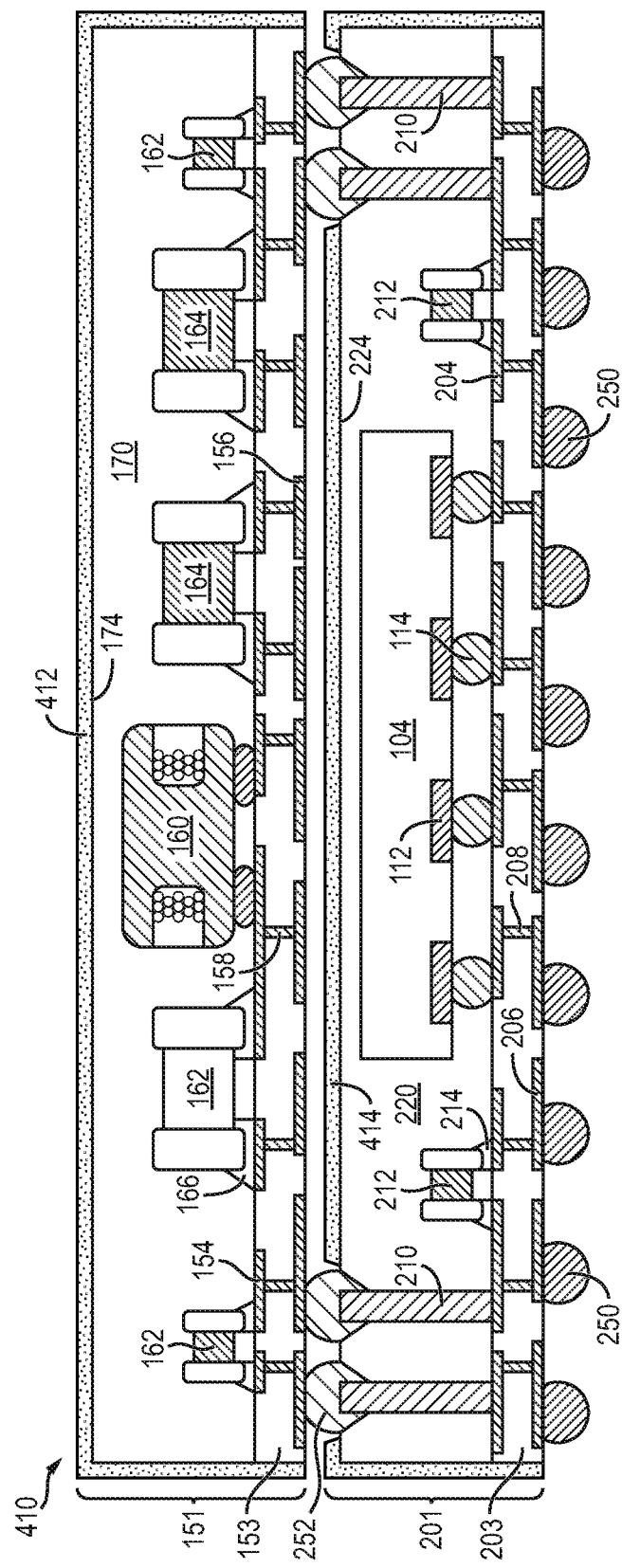
FIGS. 10a-10b illustrate the alternative combination with an EMI shield formed over the SiP module.
Figure 10B:
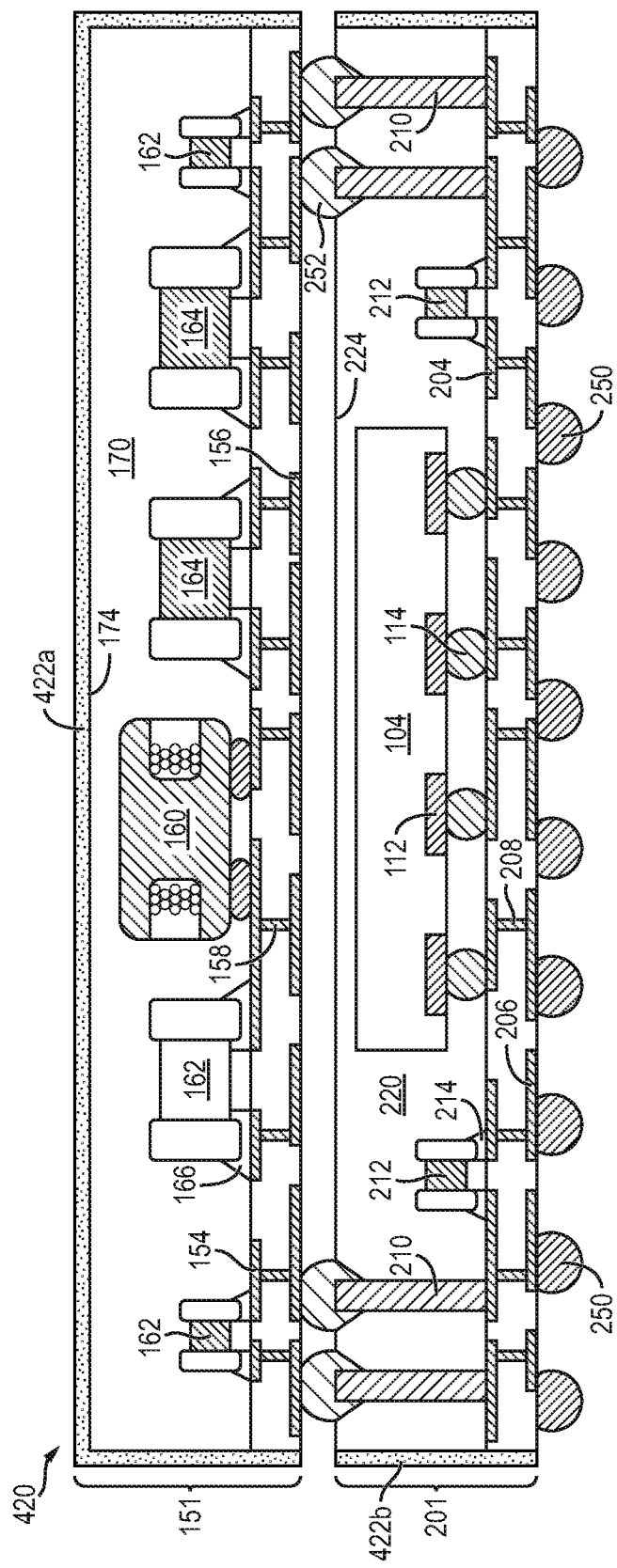

FIGS. 10a-10b illustrate a SiP module formed with substrate 200 oriented away from top SiP submodule 151 as in FIGS. 9a-9b, and with shielding layers as in FIGS. 6a-6b.

FIG. 10a illustrates SiP module 410 with shielding layer 412 formed over top SiP submodule 151. Shielding layer 414 is separately formed over bottom SiP submodule 201 prior to stacking the bottom SiP submodules on panel 180. Openings are formed in shielding layer 414 to allow interconnection between bottom SiP submodule 201 and top SiP submodule 151 through conductive pillars 210 and conductive bumps 252. In some embodiments, shielding layer 412 is electrically coupled to a ground circuit node by leaving one of the openings smaller, such that the shielding layer extends to one or more of the bumps 252 or pillars 210. Shielding layer 412 is connected to a ground circuit node through bumps 252 and substrate 150 by routing conductive layer 154 or 156 to the edge of substrate 150 to contact the shielding layer. Shielding layer 414 can similarly be connected to ground through conductive layers 204 and 206 of substrate 200. FIG. 10b illustrates shielding layer 422 formed over top SiP submodule 151 and bottom SiP submodule 201 in a single deposition step as in FIG. 6b.

Figure 11A:
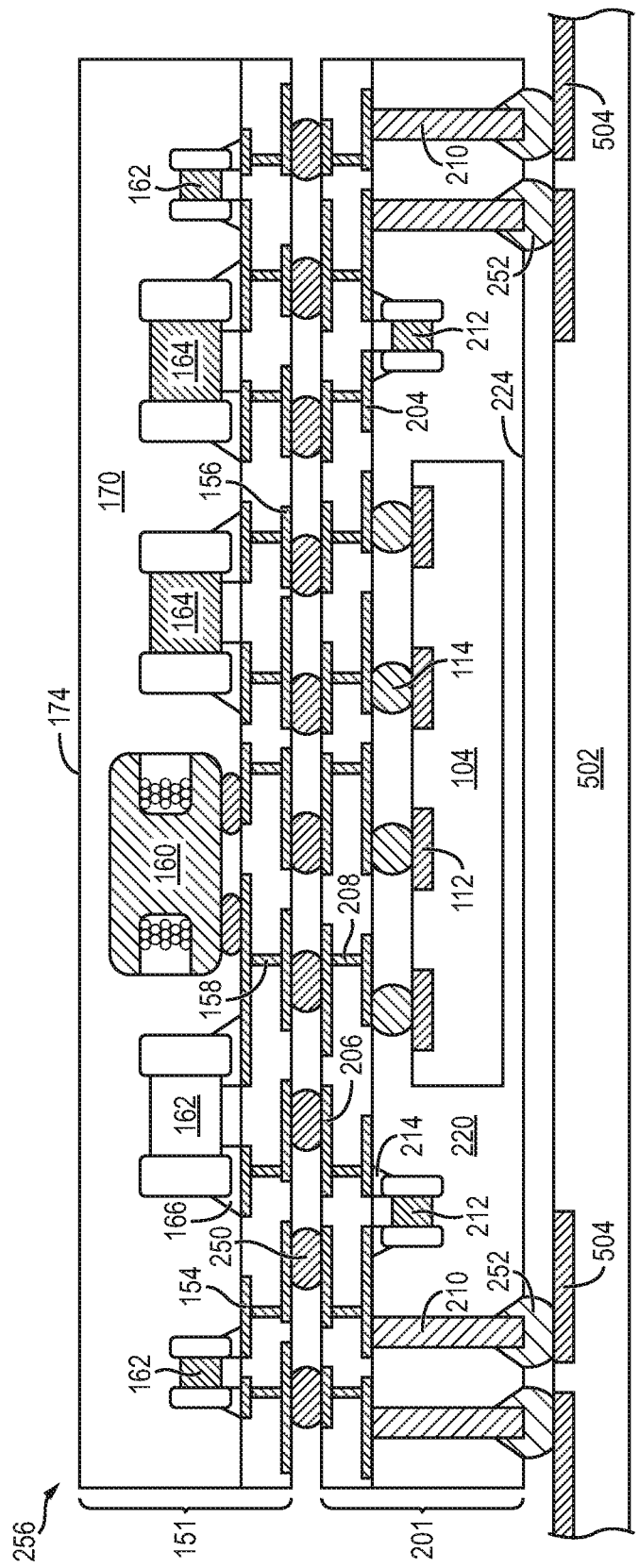
FIGS. 11a-11b illustrate a printed circuit board (PCB) with the SiP module mounted to a surface of the PCB.
Figure 11B:
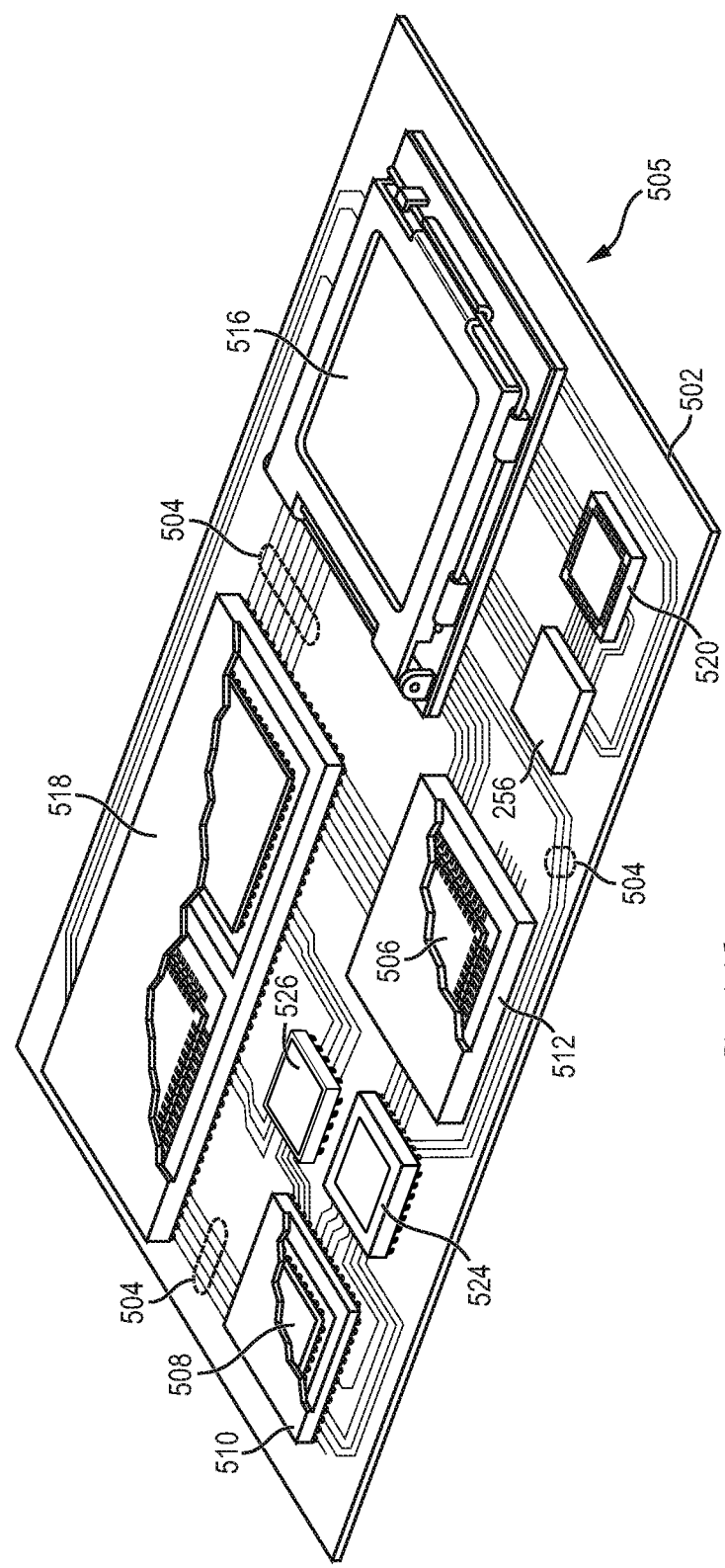

FIGS. 11a-11b illustrate incorporating the above described SiP modules into an electronic device. FIG. 11a illustrates a partial cross-section of SiP module 256 from FIG. 5 mounted onto a PCB or other substrate 502 as part of an electronic device. Bumps 252 are reflowed onto conductive layer 504 to physically attach and electrically connect SiP module 256 to substrate 502. Any of the above described SiP modules can similarly be mounted onto substrate 502. For the embodiment in FIG. 9b, bumps 250 are reflowed onto conductive layer 504 rather than bumps 252. In other embodiments, thermocompression or other suitable attachment and connection methods are used. In some embodiments, an adhesive layer is used between SiP module 256 and PCB 502.

Semiconductor die 104 is electrically coupled to conductive layer 504 through bumps 114, substrate 200, conductive pillars 210, and conductive bumps 252. Discrete devices 160-164 are coupled to conductive layer 504 through substrate 150, bumps 250, substrate 200, conductive pillars 210, and conductive bumps 252.

FIG. 11b illustrates electronic device 505 including PCB 502 with a plurality of semiconductor packages mounted on a surface of the PCB, including SiP module 256. Electronic device 505 can have one type of semiconductor package, or multiple types of semiconductor packages, depending on the application.

Electronic device 505 can be a stand-alone system that uses the semiconductor packages to perform one or more electrical functions. Alternatively, electronic device 505 can be a subcomponent of a larger system. For example, electronic device 505 can be part of a tablet, cellular phone, digital camera, communication system, or other electronic device. Alternatively, electronic device 505 can be a graphics card, network interface card, or other signal processing card that can be inserted into a computer. The semiconductor packages can include microprocessors, memories, ASICs, logic circuits, analog circuits, RF circuits, discrete active or passive devices, or other semiconductor die or electrical components.

In FIG. 11b, PCB 502 provides a general substrate for structural support and electrical interconnection of the semiconductor packages mounted on the PCB. Conductive signal traces 504 are formed over a surface or within layers of PCB 502 using evaporation, electrolytic plating, electroless plating, screen printing, or other suitable metal deposition process. Signal traces 504 provide for electrical communication between each of the semiconductor packages, mounted components, and other external systems or components. Traces 504 also provide power and ground connections to each of the semiconductor packages.

In some embodiments, a semiconductor device has two packaging levels. First level packaging is a technique for mechanically and electrically attaching the semiconductor die to an intermediate substrate. Second level packaging involves mechanically and electrically attaching the intermediate substrate to the PCB. In other embodiments, a semiconductor device may only have the first level packaging where the die is mechanically and electrically mounted directly to the PCB.

For the purpose of illustration, several types of first level packaging, including bond wire package 506 and flipchip 508, are shown on PCB 502. Additionally, several types of second level packaging, including ball grid array (BGA) 510, bump chip carrier (BCC) 512, land grid array (LGA) 516, multi-chip module (MCM) 518, quad flat non-leaded package (QFN) 520, embedded wafer level ball grid array (eWLB) 524, and wafer level chip scale package (WLCSP) 526 are shown mounted on PCB 502 along with SiP module 256. In one embodiment, eWLB 524 is a fan-out wafer level package (Fo-WLP) and WLCSP 526 is a fan-in wafer level package (Fi-WLP).

Depending upon the system requirements, any combination of semiconductor packages, configured with any combination of first and second level packaging styles, as well as other electronic components, can be connected to PCB 502. In some embodiments, electronic device 505 includes a single attached semiconductor package, while other embodiments call for multiple interconnected packages. By combining one or more semiconductor packages over a single substrate, manufacturers can incorporate pre-made components into electronic devices and systems. Because the semiconductor packages include sophisticated functionality, electronic devices can be manufactured using less expensive components and a streamlined manufacturing process. The resulting devices are less likely to fail and less expensive to manufacture resulting in a lower cost for consumers.

While one or more embodiments of the present invention have been illustrated in detail, the skilled artisan will appreciate that modifications and adaptations to those embodiments may be made without departing from the scope of the present invention as set forth in the following claims.

What is claimed:

1. A method of making a semiconductor device, comprising:
   providing a first substrate;
   forming a conductive pillar on the first substrate;
   disposing a semiconductor die on the first substrate;
   depositing a first encapsulant over the first substrate;
   providing a second substrate;
   disposing a passive device on the second substrate;
   depositing a second encapsulant over the second substrate; and
   mounting the first substrate to the second substrate after depositing the first encapsulant and second encapsulant, wherein the conductive pillar is exposed from the first encapsulant.

2. The method of claim 1, further including mounting the first substrate to the second substrate by depositing a solder between the second substrate and conductive pillar.

3. The method of claim 1, further including removing a portion of the first encapsulant around the conductive pillar.

4. The method of claim 1, further including forming a shielding layer over the second encapsulant after mounting the first substrate to the second substrate.

5. The method of claim 1, further including forming a shielding layer over the first encapsulant prior to mounting the first substrate to the second substrate.

6. The method of claim 1, further including mounting a discrete device over the second substrate opposite the passive device and outside a footprint of the first substrate.

7. A method of making a semiconductor device, comprising:
providing a first substrate;
forming a vertical interconnect structure over the first substrate;
depositing a first encapsulant over the first substrate and vertical interconnect structure;
providing a second substrate;
depositing a second encapsulant over the second substrate; and
mounting the first substrate to the second substrate after depositing the first encapsulant and second encapsulant, wherein the vertical interconnect structure is exposed from the first encapsulant.

8. The method of claim 7, further including mounting the first substrate and second substrate to a printed circuit board (PCB), wherein the first substrate and second substrate are electrically connected to the PCB through the vertical interconnect structure.

9. The method of claim 8, wherein the vertical interconnect structure includes a PCB unit.

10. The method of claim 7, wherein mounting the first substrate to the second substrate includes attaching the first substrate to the second substrate using thermocompression.

11. The method of claim 7, further including mounting a semiconductor package over the second substrate outside a footprint of the first substrate.

12. The method of claim 7, further including forming a shielding layer over the second encapsulant after mounting the first substrate to the second substrate.

13. The method of claim 7, further including forming a shielding layer over the first encapsulant prior to mounting the first substrate to the second substrate.

14. A method of making a semiconductor device, comprising:
providing a first substrate;
forming a first interconnect structure on the first substrate;
depositing a first encapsulant over the first substrate and first interconnect structure;
providing a second substrate;
depositing a second encapsulant over the second substrate; and
mounting the first substrate to the second substrate after depositing the first encapsulant and second encapsulant.

15. The method of claim 14, further including mounting the first substrate to the second substrate with a second interconnect structure extending from the first substrate to the second substrate.

16. The method of claim 15, wherein the second interconnect structure includes a plurality of conductive bumps extending from the first substrate to the second substrate.

17. The method of claim 14, wherein the first substrate is electrically connected to the second substrate through the first interconnect structure.

18. The method of claim 14, further including depositing solder on the first interconnect structure after depositing the first encapsulant.

19. The method of claim 14, further including forming a shielding layer over the first encapsulant.

20. A semiconductor device, comprising:
a first substrate;
a first interconnect structure disposed on the first substrate;
a first encapsulant deposited over the first substrate and first interconnect structure;
a second substrate mounted to the first substrate; and
a second encapsulant deposited over the second substrate.

21. The semiconductor device of claim 20, further including a second interconnect structure extending from the first substrate to the second substrate.

22. The semiconductor device of claim 21, wherein the second interconnect structure includes a plurality of conductive bumps extending from the first substrate to the second substrate.

23. The semiconductor device of claim 20, wherein the first substrate is electrically connected to the second substrate through the first interconnect structure.

24. The semiconductor device of claim 20, further including a solder deposited on the first interconnect structure.

25. The semiconductor device of claim 20, further including a shielding layer formed over the first encapsulant.

* * * * *